United States Patent [19]

Kreuder et al.

[11] Patent Number: 5,741,921
[45] Date of Patent: Apr. 21, 1998

[54] CONJUGATED POLYMERS CONTAINING HETERO-SPIRO ATOMS AND THEIR USE AS ELECTROLUMINESCENCE MATERIALS

[75] Inventors: Willi Kreuder, Mainz; Donald Lupo, Frankfurt; Josef Salbeck, Kelkheim; Hermann Schenk, Hofheim; Thomas Stehlin, Kriftel, all of Germany

[73] Assignee: Hoechst Aktiengesellschaft, Frankfurt, Germany

[21] Appl. No.: 817,376

[22] PCT Filed: Nov. 22, 1995

[86] PCT No.: PCT/EP95/04594

§ 371 Date: Apr. 17, 1997

§ 102(e) Date: Apr. 17, 1997

[87] PCT Pub. No.: WO96/17036

PCT Pub. Date: Jun. 6, 1996

[30] Foreign Application Priority Data

Nov. 25, 1994 [DE] Germany ............ 44 42 052.8

[51] Int. Cl.$^6$ ................ C09K 11/06; C08G 61/00
[52] U.S. Cl. ................ 556/406; 252/299.62; 528/13; 528/32
[58] Field of Search ............. 252/299.62; 556/406; 528/13, 32

[56] References Cited

U.S. PATENT DOCUMENTS 5,026,894  6/1991  Tour et al. ................ 558/46

FOREIGN PATENT DOCUMENTS 0 259 229  3/1988  European Pat. Off. .
0 443 861  8/1991  European Pat. Off. .
WO 90/13148  11/1990  WIPO .

OTHER PUBLICATIONS

J.M. Tour et al., J. Am. Chem. Soc., vol. 113, 1991, p. 7064 ff.
J. M. Tour et al., Polym. Prepr., 1990, p. 408 ff.
J.M. Tour et al., J. Am. Chem. Soc., vol. 112, 1990, p. 5662 ff.
H. Nishihara et al., J. Chem. Soc. Faraday Trans., vol. 90, No. 2, 1994, p. 321 ff.

*Primary Examiner*—Robert Gerstl
*Attorney, Agent, or Firm*—Frommer Lawrence & Haug LLP

[57] ABSTRACT

Conjugated polymers comprising recurring units of the formula (I),

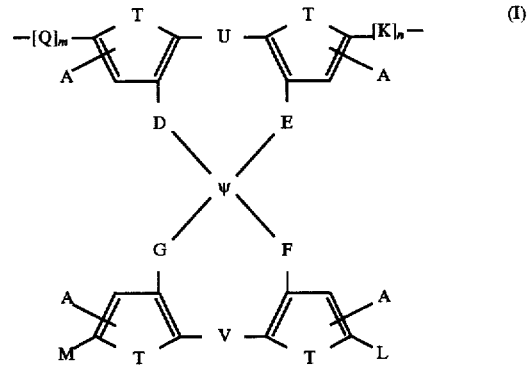

where the symbols and indices have the following meanings:

$\psi$ is an element of the 4th main group of the Periodic Table with the exception of carbon;

D, E, F, G are identical or different and are each, for example, —O— or a chemical bond;

U is, for example, a chemical bond;

V is, for example, as defined for U or is —O—;

A are identical or different and are each, for example, H or a $C_1$-$C_{20}$-hydrocarbon radical;

T is, for example, —O— or —CA=CA—, where A is as defined above;

K, L, M, Q are identical or different and are hydrocarbon radicals which can contain heteroatoms and have conjugated electron systems;

m, n are identical or different and are 0, 1, 2, 3 or 4;

are suitable as electroluminescence materials.

11 Claims, No Drawings

CONJUGATED POLYMERS CONTAINING HETERO-SPIRO ATOMS AND THEIR USE AS ELECTROLUMINESCENCE MATERIALS

RELATED APPLICATION

This application claims priority to German Application No. P 44 42 08, filed Nov. 25, 1994, incorporated herein by reference.

BACKGROUND OF THE INVENTION

1. Field of the Invention

This invention relates to the use in electrochemiluminescence materials, of conjugated polymers comprising at least one repeating unit based on a heterospiro framework. Such compounds surprisingly have excellent thermal stability, improved solubility in organic solvents, improved film-forming properties and particularly good electroluminescence with high color purity.

2. Description of the Related Art

Several publications are referenced in this application. These references describe the state of the art to which this invention pertains, and are incorporated herein by reference.

There is a great industrial need for large-area solid-state light sources for a series of applications, predominantly in the field of display elements, VDU technology and lighting engineering. The demands made on these light sources cannot at present be completely satisfactorily achieved by any of the existing technologies.

As an alternative to conventional display and lighting elements, such as incandescent lamps, gas-discharge lamps and non-self-illuminating liquid crystal display elements, use has been made for some time of electroluminescence (EL) materials and devices, such as light-emitting diodes (LEDs).

Apart from inorganic materials, low molecular weight organic electroluminescence materials and devices have also been known for about 30 years (see, for example, U.S. Pat. No. 3,172,862). Until recently, however, such devices had a very limited practical usability.

WO 90/13148 and EP-A 0 443 861 describe electroluminescence devices containing a film of a conjugated polymer as light-emitting layer (semiconductor layer). Such devices offer numerous advantages such as the opportunity of producing large-area, flexible displays simply and inexpensively. In contrast to liquid crystal displays, electroluminescence displays are self-illuminating and therefore require no additional backward lighting source.

A typical device according to WO 90/13148 comprises a light-emitting layer in the form of a thin, dense polymer film (semiconductor layer) which contains at least one conjugated polymer. A first contact layer is in contact with a first surface, a second contact layer with a further surface of the semiconductor layer. The polymer film of the semiconductor layer has a sufficiently low concentration of extrinsic charge carriers so that, on application of an electric field between the two contact layers, charge carriers are introduced into the semiconductor layer, which makes the one contact layer positively charged compared with the other and the semiconductor layer emits radiation. The polymers used in such devices are conjugated. For the purposes of the present invention, a conjugated polymer is a polymer possessing a delocalized electron system along the main chain. The delocalized electron system gives the polymer semiconducting properties and enables it to transport positive and/or negative charge carriers with high mobility.

In WO 90/13148, the polymeric material used for the light-emitting layer is poly(p-phenylenevinylene), and it is proposed that the phenyl group in such a material be replaced by a heterocyclic or a condensed carbocyclic ring system. In addition, poly(p-phenylene), PPP, is also used as electroluminescencing material.

Although good results have been obtained with these materials, the color purity, for example, is still unsatisfactory. Furthermore, with the polymers known hitherto it is hardly possible to generate a blue or white emission.

Since, in addition, the development of electroluminescence materials, particularly on the basis of polymers, can in no way be regarded as being concluded, the manufacturers of lighting and display devices are interested in a great variety of electroluminescence materials for such devices.

This is, inter alia, because only the combined action of the electroluminescence materials with the further components of the devices allows conclusions to be drawn on the quality of the electroluminescence material.

It is therefore an object of the present invention to provide new electroluminescence materials which are suitable, when used in lighting or display devices, for improving the property profile of these devices.

SUMMARY OF THE INVENTION

It has now surprisingly been found that conjugated polymers comprising at least one recurring unit based on a hereto-spiro skeleton have not only an excellent thermal stability, an improved solubility in organic solvents and improved film-forming properties, but also, in particular, good electroluminescence and photoluminescence with a high color purity.

Spiro compounds are compounds in which two ring systems are linked by a single tetravalent atom. This atom is referred to as a spiro atom, as explained in Handbook of Chemistry and Physics, 62nd edition (1981–2), CRC Press, pages C-23 to C-25.

Compounds in which two polymers are linked via a single spiro center are proposed, for example, in U.S. Pat. No. 5,026,894 and in J. M. Tour et al., J. Am. Chem. Soc. 1990, 112, 5662; J. M. Tour et al., J. Am. Chem. Soc. 1994, 113, 7064 and J. M. Tour et al., Polym. Prepr. 1990, 408, as materials for molecular electronics. Possible suitability of such compounds as electroluminescence materials cannot be derived therefrom.

DETAILED DESCRIPTION OF THE INVENTION

The invention accordingly provides conjugated polymers comprising recurring units of the formula (I),

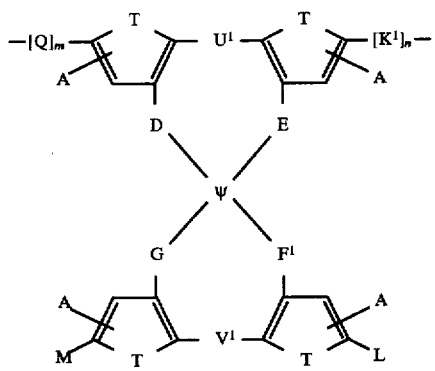

(I)

where the symbols and indices have the following meanings:

ψ is an element of the 4th main group of the Periodic Table with the exception of carbon, preferably Sn, Ge, Si, most preferably Ge or Si;

D, E, F¹, G are identical or different and are each —CR¹R²—, —O—, —S—, —NR³— or a chemical bond; where R¹, R², R³ are identical or different and are each a $C_1$–$C_{20}$-hydrocarbon radical or H or where R¹ and R² together can form an unsubstituted or substituted ring;

U¹ is —CR⁴=CR⁵— or a chemical bond;

V is as defined for U¹ or is —CR¹R²—, —O—, —S—, —NR³—, —SiR¹R²—, —SO₂—, —SO—, —CO—, where R¹, R², R³ are as defined above and R⁴, R⁵ are identical or different and can be as defined for R¹, R², R³ or are fluorine or CF₃;

A is identical or different and is H, a $C_1$–$C_{20}$-, preferably $C_1$–$C_{15}$-hydrocarbon radical, which can also contain heteroatoms, preferably —O—, —N or fluorine, not preferably a linear, branched or ring-containing alkyl, alkoxy or alkyloxycarbonyl group, —CF₃—, —CN, —NO₂, —NR⁶R⁷, A² or O—A²;

R⁶ and R⁷ are identical or different and are each H, a $C_1$–$C_{20}$-hydrocarbon radical which can be aliphatic, aromatic, linear, branched or alicyclic, wherein R⁶ and R⁷ may together form a ring; R⁶ and R⁷ are preferably methyl, ethyl, t-butyl, cyclohexyl, 3-methylphenyl or together

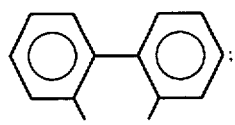

A² is an aromatic radical having up to 22 carbon atoms, preferably phenyl, biphenyl, 1-naphthyl, 2-naphthyl, 2-thienyl, 2-furanyl, where each of these groups A² can bear one or two radicals as defined for A;

T is —O—, —S—, —NR³—, —CR¹R²—, —CH=N—, —CA=CA—, —CH=CA—, —CH=CF— or —CF=CF—, where R¹, R², R³ and A are as defined above; T is preferably —CH=CH—;

K¹, L, M, Q are identical or different and are hydrocarbon radicals which can contain heteroatoms and have conjugated electron systems; where K¹, L, M, and Q can also be joined to the groups A in the respective ortho positions to form a ring which is saturated, partially unsaturated or has maximum unsaturation, with a fused aromatic ring system preferably being present;

m, n are identical or different and are 0, 1, 2, 3 or 4.

DESCRIPTION OF THE PREFERRED EMBODIMENTS

Preference is given to conjugated polymers comprising recurring units of the formula (II),

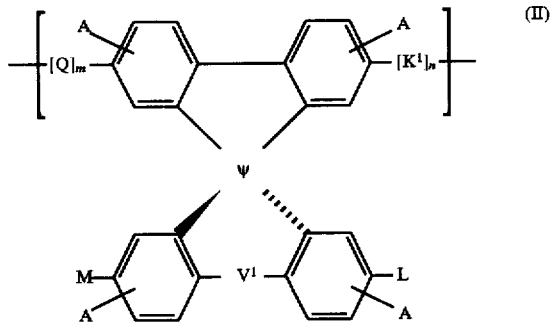

(II)

where the symbols and indices have the following meanings:

ψ is Sn, Ge or Si;

Q, K¹, L, M are identical or different and are each from one to fifteen identical or different arylene and/or heteroarylene and/or vinylene groups which may be unsubstituted or substituted;

A is identical or different and can be as defined in the formula (I);

m, n are identical or different and are 0 or 1.

The polymers of the invention having the formula (I) or (II) have, in particular, a high color purity of the emission.

For the purposes of the invention, a polymer is a compound whose electroluminescence spectrum remains essentially unchanged on adding further recurring units.

The polymers of the invention having the formula (I) or (II) have in general from 2 to 1000, preferably 2 to 500, most preferably from 2 to 100, recurring units.

Preference is further given to those polymers of the formula (II) in which the symbols and indices have the following meanings:

A is identical or different and is R¹, R², R³ and/or R⁴;

Q, K¹ are identical or different conjugated $C_2$ to $C_{100}$-hydrocarbon radicals, in particular

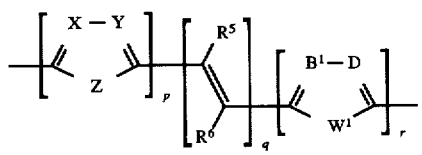

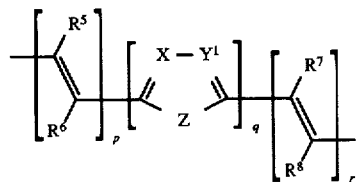

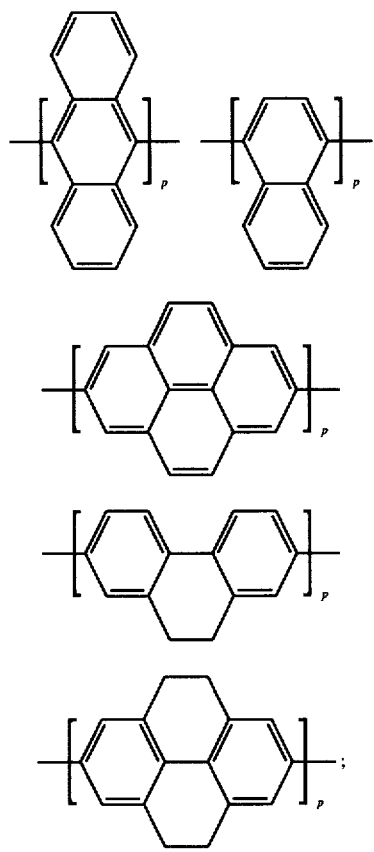

X, Y¹, B¹, D are identical or different and are CR⁵ or N;

Z, W are identical or different and are —O—, —S—, —NR⁵—, —CR⁵R⁶—, —CR⁵=CR⁶—, —CR⁵=N—;

p, q, r independently of one another are identical or different and are 0, or 1 to 5;

R¹, R², R³, R⁴, R⁵, R⁶, R⁷, R⁸ are identical or different and are each H, a straight-chain or branched alkyl, alkoxy or ester group having from 1 to 22 carbon atoms, aryl and/or aryloxy groups, preferably phenyl and/or phenyloxy groups, where the aromatic may be substituted by $C_1$–$C_{22}$-alkyl, $C_1$–$C_{22}$-alkoxy, Br, Cl, F, CN and/or NO₂, or are Br, Cl, F, CN, NO₂, CF₃;

L, M are identical or different and are

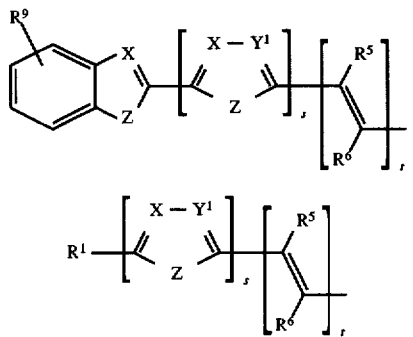

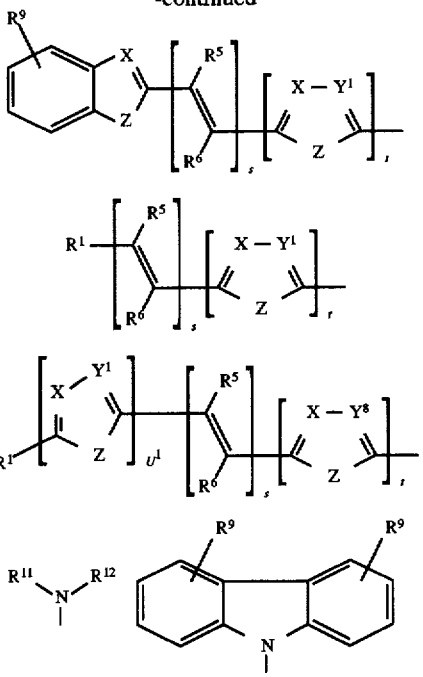

R⁹ are identical or different and are each H, an unbranched or branched alkyl or alkoxy group having from 1 to 22 carbon atoms, —CN, —NO₂, —NR¹¹R¹², phenyl, biphenyl, 1-naphthyl, 2-naphthyl, 2-thienyl, 2-furanyl, where aryls and heteroaryls can bear a further substituent R⁹;

X, Y¹ are identical or different and are =CR⁵—, =N—;

Z are identical or different and are —O—, —S—, —NR¹¹—, CR⁵R⁶, —CR⁵=CR⁶—, —CR⁵=N—;

R¹¹, R¹² are identical or different and are each H, an unbranched or branched alkyl group having from 1 to 22 carbon atoms, phenyl, 3-methylphenyl, biphenyl, 1-naphthyl, or 2-naphthyl.

Particular preference is given to compounds of the formula (II) in which:

Q, K¹ are identical or different and are

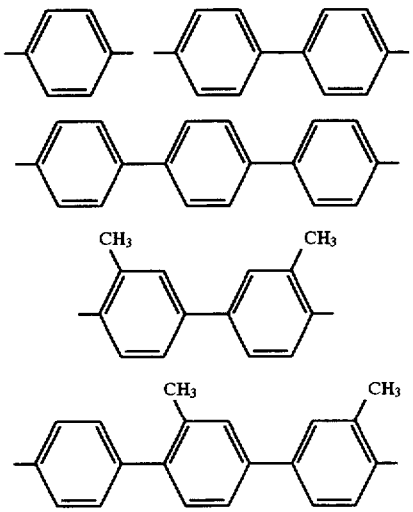

-continued
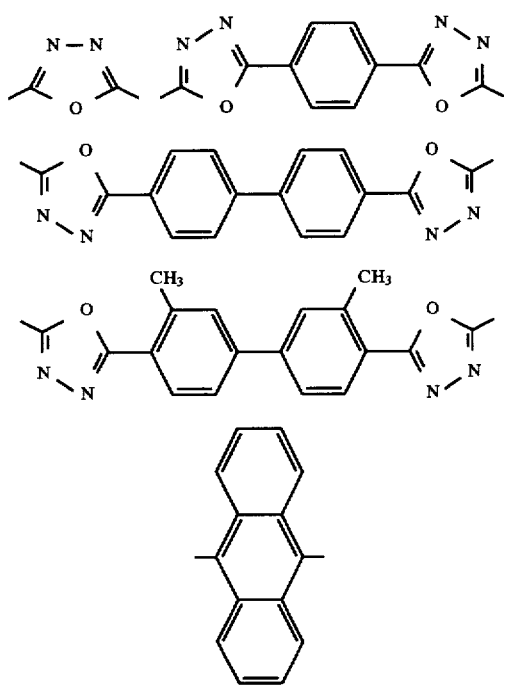
m, n are identical or different and are 0 or 1;
L, M are identical or different and are
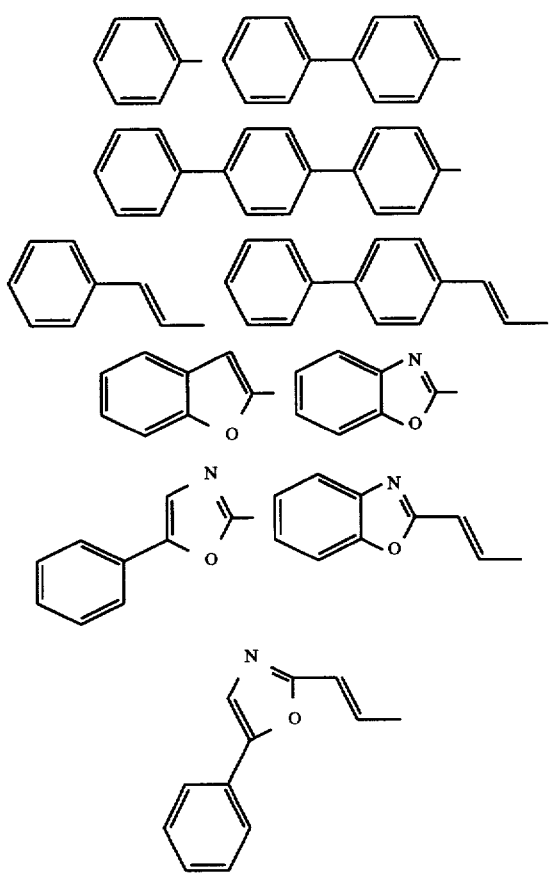
-continued
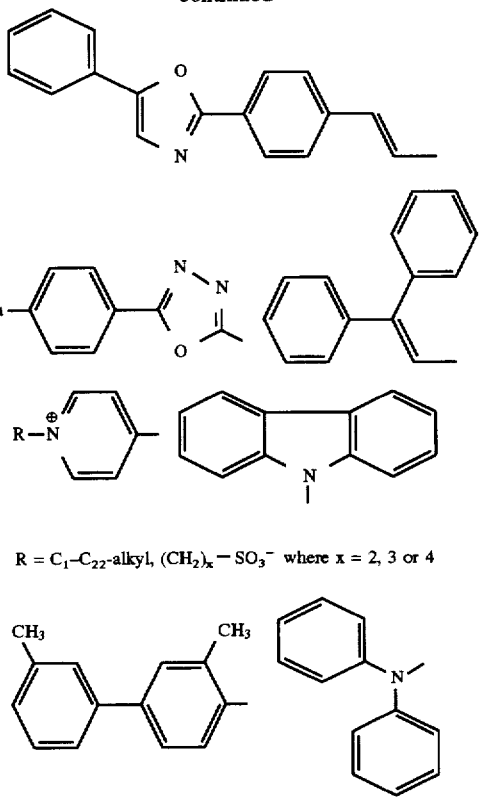
$R = C_1-C_{22}\text{-alkyl}, (CH_2)_x-SO_3^-$ where $x = 2, 3$ or $4$
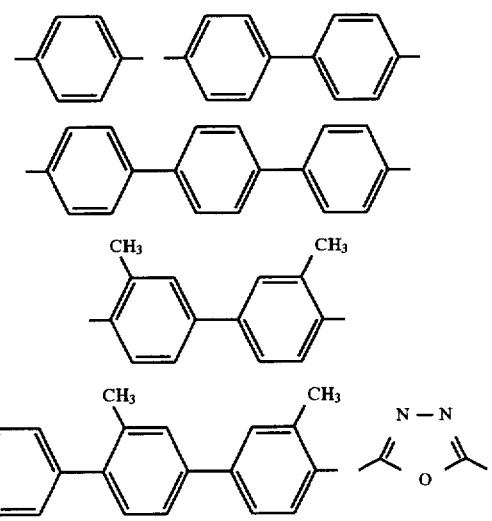
Very particular preference is given to compounds of the formula (II) in which
Q, K¹ are identical or different and are

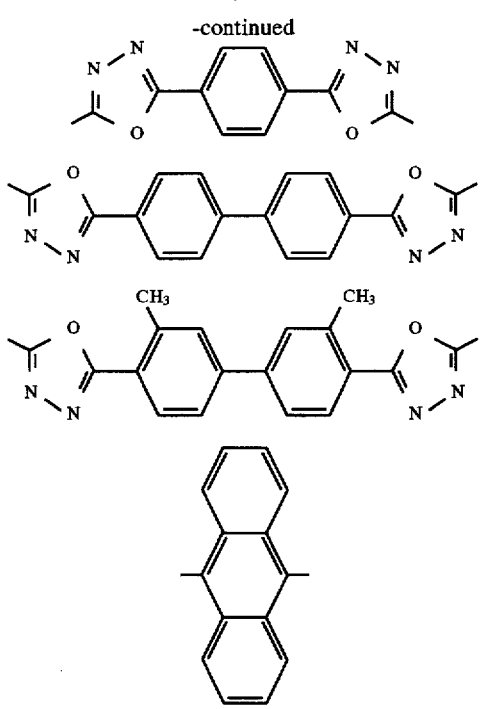

m+n is 0 or 1;
L, M are identical or different and are

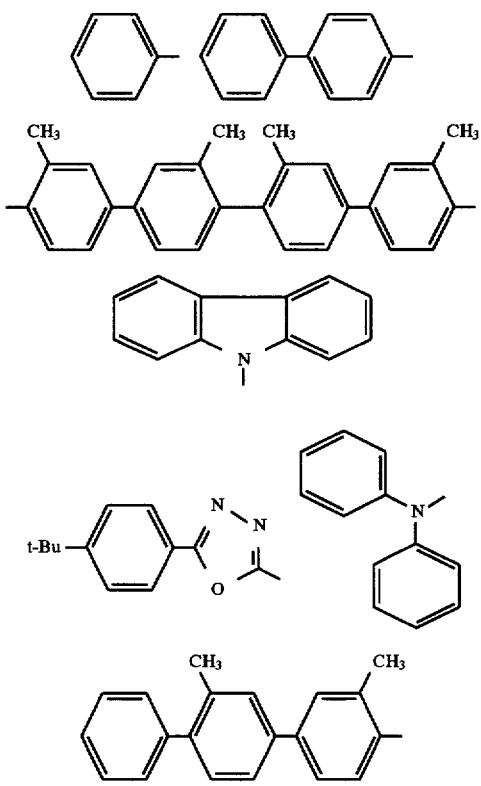

For some applications it can be advantageous to replace one, a plurality or all of the hydrogen atoms, preferably those on aromatic rings, by fluorine atoms.

The compounds of the invention having the formula (I) are homopolymers or copolymers, i.e. the compounds of the formula (I) can also have different recurring units.

The polymers of the invention having the formula (I) also have a considerably increased solubility in organic solvents and good film-forming properties. This aids the production of electroluminescence devices and increases their life. In addition, the covalently bonded arrangement of the substituents via the spiro atoms, perpendicular to the conjugated main chain, allows a molecular structure such that certain properties can be set without interfering with the conjugation in the main chain. Thus, the polymer chain can possess, for example, charge transport or charge injection properties, while the substituents possess light-emitting properties. The emission properties of the compounds used according to the invention can be adjusted over the entire range of the visible spectrum by selection of suitable substituents. The spatial proximity of the two halves which is fixed by the covalent linkage is here favorable for energy transmission (see, for example, B. Liphardt, W. Lüttke, Liebigs Ann. Chem. 1981, 1118).

The compounds of the invention having the formula (I) are well suited to achieving blue electroluminescence.

The preparation of the polymers of the invention can be carried out by literature methods known per se, as are described in the standard works on organic synthesis, e.g. Houben-Weyl, Methoden der Organischen Chemie, Georg-Thieme-Verlag, Stuttgart and in the volumes of the series "The Chemistry of Heterocyclic Compounds", A. Weissberger, E. C. Taylor (eds.), in particular volume 13/5, pp. 30–87.

The preparation is carried out under reaction conditions which are known and suitable for the specified reactions. Use can also be made of variants known per se which are not mentioned in more detail here.

Starting compounds used for preparing the polymers of the invention are preferably monomers containing a or 9,9'-spirobi-9-stannafluorene, 9,9'-spirobi-9-germafluorene and particularly preferably 9,9'-spirobi-9-silafluorene building block, which in each case are substituted in the 2,7 or, if desired, 2',7' positions.

One method of synthesizing these monomers is based, for example, on the synthesis of 9,9'-spirobi-9-silafluorene, e.g. from 2,2'-dibromobiphenyl and silicon tetrachloride via 2,2'-dilithiobiphenyl, as described by H. Gilman and R. D. Gorsich, J. Am. Chem. Soc. 1958, 80, p. 1883, which is subsequently substituted further in a suitable manner.

Possible ways of functionalizing the carbon analog 9,9'-spirobifluorene are described in J. H. Weisburger, E. K. Weisburger, F. E. Ray, J. Am. Chem. Soc. 1959, 72, 4253; F. K. Sutcliffe, H. M. Shahidi, D. Paterson, J. Soc. Dyers Colour 1978, 94, 306; and G. Haas, V. Prelog, Helv. Chim. Acta 1969, 52, 1202; they are also suitable for functionalizing the hetero-spiro compounds of the invention.

It can be advantageous to achieve the desired substitution pattern of the monomeric 9,9'-spirobi-9-silafluorene by spiro linkage of starting materials already suitably substituted, for example using 2,7-difunctionalized 9,9-dichloro-9-silafluorene, and then, if desired, to further functionalize the 2',7' positions still free after formation of the spiro center (for example by halogenation or acylation, with subsequent C—C-linkage after conversion of the acetyl groups into aldehyde groups, or by heterocycle formation after conversion of the acetyl groups into carboxylic acid groups).

The further functionalization can be carried out by literature methods known per se, as described in standard works on organic synthesis, e.g. Houben-Weyl, Methoden der Organischen Chemie, Georg-Thieme Verlag, Stuttgart and in the corresponding volumes of the series "The Chemistry of Heterocyclic Compounds" by A. Weissberger and E. C. Taylor (Editors).

For the synthesis of the groups Q, $K^1$, L, M, reference may be made, for example, to DE-A 23 44 732, 24 50 088, 24 29 093, 25 02 904, 26 36 684, 27 01 591 and 27 52 975 for compounds having 1,4-phenylene groups; DE-A 26 41 724 for compounds having pyrimidine-2,5-diyl groups; DE-A 40 26 223 and EP-A 03 91 203 for compounds having pyridine-2,5-diyl groups; DE-A 32 31 462 for compounds having pyridazine-3,6-diyl groups; N. Miyaura, T. Yanagi and A. Suzuki in Synthetic Communications 1981, 11, 513 to 519, DE-C-3 930 663, M. J. Sharp, W. Cheng, V. Snieckus in Tetrahedron Letters 1987, 28, 5093; G. W. Gray in J. Chem. Soc. Perkin Trans II 1989, 2041 and Mol. Cryst. Liq. Cryst. 1989, 172, 165, Mol. Cryst. Liq. Cryst. 1991, 204, 43 and 91; EP-A 0 449 015; WO 89/12039; WO 89/03821; EP-A 0 354 434 for the direct linkage of aromatics and heteroaromatics.

The preparation of disubstituted pyridines, disubstituted pyrazines, disubstituted pyrimidines and disubstituted pyridazines is given, for example, in the corresponding volumes of the series "The Chemistry of Heterocyclic Compounds" by A. Weissberger and E. C. Taylor (Editors).

Starting from the abovementioned monomers, the polymerization to give the polymers of the invention having the formula (I) is possible by a number of methods.

For example, derivatives of 9,9'-spirobi-9-silafluorene groups), can be polymerized oxidatively (e.g. using $FeCl_3$, see, inter alia, P. Kovacic, N. B. Jones, Chem. Ber. 1987, 87, 357 to 379; M. Weda, T. Abe, H. Awano, Macromolecules 1992, 25, 5125) or electrochemically (see, for example, N. Saito, T. Kanbara, T. Sato, T. Yamamoto, Polym. Bull. 1993, 30, 285).

The polymers of the invention having the formula (I) can likewise be prepared from 2,7-difunctionalized 9,9'-spirobi-9-silafluorene derivatives. Dihaloaromatics can be polymerized with copper/triphenylphosphine (see, for example, G. W. Ebert, R. D. Rieke, J. Org. Chem. 1988, 53, 44829 or nickel/triphenylphosphine catalysis (see, for example, H. Matsumoto, S. Inaba, R. D. Rieke, J. Org. Chem. 1983, 48, 840).

Aromatic diboronic acids and aromatic dihalides or mixed aromatic halides/boronic acids can be polymerized with palladium catalysis by means of coupling reactions (see, for example, M. Miyaura, T. Yanagi, A. Suzuki, Synth. Commun. 1981, 11, 513; R. B. Miller, S. Dugar, Organometallics 1984, 3, 1261).

Aromatic distannanes can be polymerized, for example, as indicated in J. K. Stille, Angew. Chem. Int. Ed. Engl. 1986, 25, 508 with palladium catalysis.

In addition, the abovementioned dibromo compounds can be converted into the dilithio or diGrignard compounds which are then polymerized with further dibromo compound by means of $CuCl_2$ (see, for example, G. Wittig, G. Klar, Liebigs Ann. Chem. 1967, 704, 91; H. A. Staab, F. Bunny, Chem. Ber. 1967, 100, 293; T. Kaufmann, Angew. Chem. 1974, 86, 321 to 354) or by electron transfer of unsaturated 1,4-dihalo compounds (see, for example, S. K. Taylor, S. G. Bennett, K. J. Harz, L. K. Lashley, J. Org. Chem. 1981, 46, 2190).

However, the synthesis of the polymers of the invention having the formula (I) can also be carried out by polymerization of a 2,7-difunctionalized 9,9'-spirobi-9-silafluorene derivative with a further, suitably difunctionalized compound.

Thus, for example, 2,7-dibromo-9,9'-spirobi-9-silafluorene can be polymerized with biphenyl-4,4'-bisboronic acid. In this way, it is possible to build up various heterocyclic units simultaneously with the polymerization step, for example the formation of oxadiazole units from difunctional carboxylic acid halides and difunctional carboxylic hydrazides or from the corresponding dicarboxylic acid and hydrazine sulfate (B. Schulz, E. Leibnitz, Acta Polymer. 1992, 43, page 343; JP-A 05/178, 990, or alternatively from dicarboxylic acid halides and bistetrazoles (C. A. Abshire, C. S. Marvel, Makromol. Chem. 1961, 44 to 46, page 388).

Copolymers can be prepared, for example, by jointly polymerizing different compounds of the formula (I).

The work-up is carried out by known methods with which those skilled in the art are familiar, as described, for example, in R. J. Young, P. A. Lovell, Introduction to Polymers, Chapman & Hall, London, 1991. For example, the reaction mixture can be filtered, diluted with aqueous acid, extracted and the crude product obtained after drying and taking off the solvent can be further purified by reprecipitation.

Terminal bromine atoms can, for example, be removed reductively using $LiAlH_4$ (see, for example, J. March, Advanced Organic Chemistry, 3rd edition, McGraw-Hill, p. 510).

The polymers of the invention can be used as electroluminescence materials.

The invention accordingly also provides for the use of polymers of the formula (I) as electroluminescence material.

For the purposes of the invention, electroluminescence materials are materials which can be used as an active layer in an electroluminescence device. Active layer means that the layer is capable of emitting light on application of an electric field (light-emitting layer) and/or that it improves the injection and/or the transport of the positive and/or negative charges (charge injection or charge transport layer). Particular mention should be made of the excellent hole-conducting properties of the materials of the invention which can be used, for example, as hole transport layers in photocopiers and laser printers.

The invention accordingly also provides an electroluminescence material comprising one or more polymers of the formula (I).

The electroluminescence material of the invention usually contains one or more polymers of the formula (I) as main component, i.e. to an extent of greater than 50% by weight, or as additive.

To be used as electroluminescence materials, the solutions of the polymers of the formula (I) are generally applied in the form of a film to a substrate by known methods with which those skilled in the art are familiar such as casting, dipping, spin coating or curtain coating.

The invention additionally provides a process for producing an electroluminescence material, which comprises applying a polymer of the formula (I) in the form of a film to a substrate.

In addition, the invention provides an electroluminescence device comprising one or more active layers, wherein at least one of these active layers comprises one or more polymers of the invention having the formula (I). The active layer can, for example, be a light-emitting layer and/or a transport layer and/or a charge injection layer.

The general structure of such electroluminescence devices is described, for example, in U.S. Pat. No. 4,539,507 and U.S. Pat. No. 5,151,629. Electroluminescence devices containing polymers are described, for example, in WO 90/13148 or EP-A 0 443 861.

They usually comprise an electroluminescing layer between a cathode and an anode, with at least one of the electrodes being transparent. In addition, an electron injection and/or electron transport layer can be introduced between the electroluminescing layer and the cathode, and/or a hole injection and/or hole transport layer can be introduced between the electroluminescing layer and the anode. The cathode can be, for example, Ca, Mg, Al, In, Mg/Ag. The anode can be, for example, Au or ITO (indium oxide/tin oxide) on a transparent substrate, for example of glass or a transparent polymer.

In operation, the cathode is placed at a negative potential compared with the anode. Electrons from the cathode are thus injected into the electron injection layer/electron transport layer or directly into the light-emitting layer. At the same time, holes from the anode are injected into the hole injection layer/hole transport layer or directly into the light-emitting layer.

The injected charge carriers move toward one another through the active layers under the action of the applied potential. This leads, at the interface between charge transport layer and light-emitting layer or within the light-emitting layer, to electron/hole pairs which recombine with emission of light.

The color of the emitted light can be varied by means of the compound used as light-emitting layer, with not only copolymers but also mixtures of the polymers of the invention with other electrooptically active or passive materials being expressly included.

Electroluminescence devices are used, for example, as self-illuminating display elements such as control lamps, alphanumeric displays, signs, and in optoelectronic couplers. The materials of the invention are, owing to their good hole transport properties, also suitable as photoconductive elements, for example in photocopiers and laser printers.

The invention is illustrated by the examples, which are, of course, not to be considered in any way limitative of the invention. Numerous changes and modifications can be made with respect to the invention.

EXAMPLES

Example 1

2,2'-dilithiobiphenyl 26 ml of a solution of 28 mmol of n-BuLi in absolute diethyl ether (ether) were added dropwise over a period of 5 minutes to an ice-cooled, vigorously stirred solution of 4.0 g (12.9 mmol) of 2,2-dibromobiphenyl in 40 ml of ether and the mixture was subsequently stirred for a further 5 hours at room temperature.

Example 2

Bis(biphenyl-2,2'-diyl)silane (9,9'-spirobi-9-silafluorene)

A solution of 24 mmol of 2,2'-dilithiobiphenyl in 70 ml of ether, prepared as described in Example 1, was added dropwise over a period of one hour to a vigorously stirred solution of 1.87 g (11 mmol) of silicon tetrachloride in 30 ml of ether. The mixture was stirred for a further 1.5 hours at room temperature and refluxed for 3 hours. Subsequently, 50 ml of benzene were added and the mixture was refluxed for a further 2 hours. After shaking with 100 ml of water, the organic phase was dried over magnesium sulfate, filtered and the major part of the ether was distilled off on a rotary evaporator. From the cooled solution, 1.45 g of crude product having a melting point of from 222° to 225° C. were isolated. After evaporation, the filtrate gave a further 0.6 g (total yield 56%). Crystallization from ethanol gives a product having a melting point of 227° C.

| | Elemental analysis: | | |
|---|---|---|---|
| % | C | H | Si |
| Calc. | 86.72 | 4.85 | 8.44 |
| Found | 86.86 | 4.98 | 8.33 |

The remarkably high stability of this compound is shown by the boiling point of 460° C. which is reached without visible decomposition.

Example 3

Bis(biphenyl-2,2'-diyl)germane (9,9'-spirobi-9-germafluorene)

A solution of 50 mmol of 2,2'-dilithiobiphenyl prepared in 140 ml of ether, as described in Example 1, was reacted as described in Example 2 with 5.35 g (25 mmol) of germanium tetrachloride. After work-up and recrystallization from ethyl acetate, 2.77 g (29%) of product were obtained. White prisms, melting point 245° C., boiling point 470° C. without decomposition.

| | Elemental analysis: |
|---|---|
| % | Ge |
| Calc. | 19.23 |
| Found | 18.88 |

Example 4

Biphenyl-2,2'-diyl-silicon dichloride 78 mmol of 2,2'-dilithiobiphenyl prepared in 230 ml of ether, as described in Example 1, was reacted as described in Example 2 with 252 g (1.48 mol, i.e. 18-fold excess) of silicon tetrachloride. Aftr distilling off the excess SiCl$_4$ and work-up, 3.5 g of a solid product were obtained and after recrystallization from ethyl acetate this gave 2.89 g (22%) of bis(biphenyl-2,2'-diyl)silane, as described in Example 2. The combined mother liquors were evaporated and the remaining oil was distilled at 0.01 mbar, with a small amount of biphenyl going over as initial fraction and 7.41 g (38%) of biphenyl-2,2'-diylsilicon dichloride going over as main fraction at 108° to 110° C.

| | Elemental analysis: | |
|---|---|---|
| % | Cl | Si |
| Calc. | 28.3 | 11.33 |
| Found | 26.5 | 10.75 |

Example 5

10,10-Biphenyl-2,2'-diylphenoxasilin [348.48]

A solution of 120 mmol of 2,2'-dilithiodiphenyl ether in 180 ml of THF, prepared as described by H. Gilman, W. J. Trepka, J. Org. Chem. 1962, 27, 1418, was added to a solution of 37.7 g (150 mmol) of biphenyl-2,2'-diylsilicon dichloride, as described in Example 4, in 200 ml of THF. The mixture was stirred for 12 hours at 20° C., hydrolyzed with a mixture of ice and sulfuric acid and the aqueous phase was extracted with ether. After work-up by distillation at <0.05 mm, the main fraction going over at 150° C. was recrystallized from ethanol.

Yield: 12.5 g (30%).

Example 6

Bis (bibenzyl-2,2' -diyl)silane

A solution of 2.1 ml (20 mmol) of silicon tetrachloride in 50 ml of THF was added dropwise to a solution of 2,2'-dilithiobibenzyl which had previously been prepared from 15 g (40 mmol) of 2,2'-dibromobibenzyl and 97 mmol of a 1.7 molar solution of n-butyllithium in a hexane fraction. The mixture was refluxed for 1 hour and worked up as in Example 5. At 0.05 mm, 5.0 g of an oil which solidified went over between 125° and 210° C., and after being crystallized twice this gave 1.0 g (13%) of bis(bibenzyl-2,2'-diyl)silane having a melting point of 175° C.

| | Elemental analysis: | |
|---|---|---|
| % | C | H |
| Calc. | 86.60 | 6.19 |
| Found | 86.21 | 6.05 |

Example 7

Bis(stilbene-2,2'-diyl)silane via Bis(α,α'(β')-dibromobibenzyl-2,2'-diyl)silane A slurry of 1.94 g (5 mmol) of bis(bibenzyl-2,2'-diyl) silane, prepared as described in Example 6, and 1.78 g (10 mmol) of N-bromosuccinimide in 100 ml of tetrachloromethane were heated to boiling while being irradiated with a 300 W incandescent tungsten lamp. The succinimide formed was filtered off with suction, the filtrate was evaporated to dryness on a rotary evaporator, the residue was taken up in 15 ml of toluene and admixed with 2 ml of 2-dimethylaminoethanol. The mixture was stirred for 48 hours and then boiled for 6 hours. The toluene was removed in vacuo, the residue was admixed with 50 ml of 5% strength by weight sodium hydroxide solution and extracted by shaking with ether. After drying over magnesium sulfate, the ether was evaporated and the residue was purified by chromatography in toluene/cyclohexane on 30 g of silica gel.

Example 8

3,3',5,5'-Tetraphenyl-9-sila-9-spiro-9H-bifluorene via tetrakis(biphenyl-4-yl)silane 10.8 g (46.3 mmol) of 4-bromobiphenyl were dissolved together with 1.95 g (11.6 mmol) of silicon tetrachloride in 100 ml of absolute ether and subsequently treated with 2.5 g (110 mmol) of sodium. The mixture was refluxed until the metal had dissolved and then stirred for a further 4 hours at room temperature. After removing the ether, the residue was extracted with toluene in a Soxhlet apparatus. Yield: 6.7 g (90%). Mp. 281° C. from xylene.

5.4 g (10 mmol) of tetrakis(biphenyl-4-yl)silane were dissolved in 200 ml of 1,2-dichlorobenzene and admixed with 6.5 g (40 mmol) of iron(III) chloride (added in portions) while passing nitrogen through the solution. The mixture was heated to boiling over a period of 3 hours. When HCl could no longer be detected in the off-gas as $NH_4Cl$, the mixture was evaporated on a rotary evaporator, the residue was digested a number of times with 5% strength hydrochloric acid and the residue was recrystallized from xylene with the addition of 1 g of silica gel. Yield: 2.7 g (51%).

Example 9

Biphenyl-2,2'-diyldibenzosilinane

Bis(2-chlorophenyl)methane was prepared by the method of Chang and Gorey, Organomet. 8, 1890 (1989). 0.1 mol of this substance was lithiated using 0.22 mol of BuLi as described in Example 1. The solution in ether obtained was added dropwise to a solution of 25.1 g (0.1 mol) of biphenyl-2,2'-diylsilicon dichloride, as described in Example 4, in 150 ml of THF. The mixture was stirred for 12 hours at room temperature, hydrolyzed with a mixture of ice and sulfuric acid and the aqueous phase was extracted with ether. After work-up by distillation in a high vacuum<0.05 mm Hg, the main fraction going over at about 150° C. was recrystallized from ethanol. Yield: 13.9 g (40%).

Example 10

Biphenyl-2,2'-diyldibenzosilinan-9-one 10.4 g (30mmol) of biphenyl-2,2'-diyldibenzosilinane, as described in Example 9, were admixed with a solution of 3.33 g (30 mmol) of selenium dioxide, dissolved in 22 ml of 1,4-dioxane and 1.4 ml of water. The mixture was then heated to boiling, the precipitated selenium was filtered off while still hot and extracted with hot dioxane. Recrystallization from i-propanol gave 9.9 g of product (91%).

Example 11 a) 10,10'-(4,4'-Dinitrobiphenyl-2,2'-diyl) dibenzosilinan-9-one 5.10 g (21 mmol) of $Cu(NO_3)_2 \times 3H_2O$ are taken up in 40 ml of acetic anhydride at room temperature and stirred. After a few minutes, the internal temperature rises to from about 40° to 45° C., and the blue suspension becomes turbid. 3.6 g (10 mmol) of (biphenyl-2,2'-diyl)dibenzosilinan-9-one are subsequently added, and stirring is continued at 40° C.

The reaction is complete after 4 hours at 40° C. During the reaction, the suspension changes in color to turquoise. It is carefully stirred into about 200 ml of water and extracted a number of times by shaking with chloroform. The organic phase is evaporated in a rotary evaporator, the residue is dissolved in chloroform, and the solution is precipitated using hexane: 4.7 g of colorless product.

b) 10,10'-(4,4'-Diaminobiphenyl-2,2'-diyl) dibenzosilinan-9-one

A mixture of 5 g of 10,10'-(4,4'-dinitrobiphenyl-2,2'-diyl) dibenzosilinan-9-one and 4.5 g of iron powder is refluxed in 150 ml of ethanol while 15 ml of conc. HCl is added dropwise over a period of 30 minutes. After refluxing for a further 30 minutes, excess iron is filtered off. The green filtrate is introduced into a solution of 400 ml of water, 15 ml of conc. $NH_4OH$ and 20 g of Na, K tartrate. The colorless diamine is filtered off from the dark-green solution of the iron complex. For purification, the diamine is dissolved in dilute HCl, stirred at room temperature with activated charcoal (Darco) and filtered. The filter solution is neutralized by dropwise addition of $NH_4OH$ with mechanical stirring, and the precipitated product is filtered off with suction, giving 3.5 g of virtually colorless 10,10'-(4,4'-diaminobiphenyl-2, 2'-diyl)dibenzosilinan-9-one, which is then recrystallized from methanol.

c) 10,10'-(4,4'-Dibromobiphenyl-2,2'-diyl) dibenzosilinan-9-one 2.0 g of 10,10'-(4,4'-diaminobiphenyl-2,2'-diyl) dibenzosilinan-9-one are dissolved in 20 ml of water and 5 ml of conc. hydrobromic acid, the solution is cooled to about 0° C., and a solution of 0.8 g of $NaNO_2$ in about 5 ml of water is slowly added while maintaining this temperature. The mixture is stirred at this temperature for about 30 minutes, and the solution of the resultant bisdizonium salt is poured into an ice-cooled solution of 1 g of CuBr in 10 ml of HBr. The resultant solution is stirred at 100° C., during which gas evolution is evident and the resultant product is deposited as a white precipitate. When the gas evolution is complete, the product is filtered off with suction, washed with $NaHCO_3$ solution until neutral and washed with water until salt-free. The product is subsequently reprecipitated from chloroform with hexane: 1.3 g of virtually colorless powder.

Example 12

Polymerization of 10,10-(4,4'-dibromobiphenyl-2,2'-diyl) dibenzosilinan-9-one (Polymer 1)

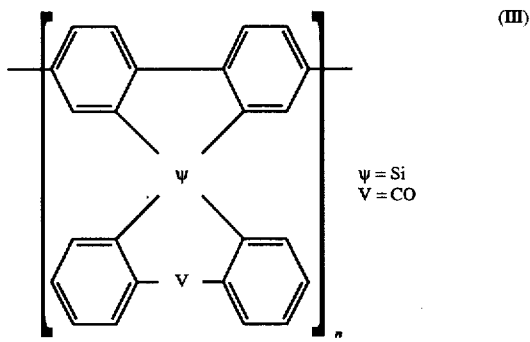

(III)

Under argon, a solution of 1.555 g of 10,10-(4,4'-dibromobiphenyl-2,2'-diyl)dibenzosilinan-9-one as described in Example 11 in 30 ml of dry THF was prepared and heated to 60° C. The warm solution was quickly added under protective gas to a refluxing mixture, likewise under protective gas, of 825 mg of $Ni(cod)_2$, 470 mg of 2,2'-bipyridyl and 0.4 ml of 1,5-cyclooctadiene (COD) in 20 ml of dry THF. The polymerization commenced immediately, with the deep blue reaction mixture becoming red. The mixture was refluxed for a further 6 hours and was subsequently cooled to room temperature. The red polymer was filtered off with suction and washed with THF, dilute aqueous HCl and water.

Extraction with 200 ml of chloroform gave a first soluble polymer fraction (further soluble fractions are obtainable by extraction, for example, with 1,2-dichloroethane and 1-chloronaphthalene) which is purified by shaking with ethylenediaminetetraacetic acid (3× with an aqueous solution adjusted to pH 7 to 8 with ammonia, once at pH 3) and subsequent shaking with dilute hydrochloric acid and water. The dried chloroform solution was evaporated to 10 ml and the polymer was precipitated by dropping into 70 ml of methanol. The polymer obtained is yellowish.

Example 13

Polymerization of 10,10-(4,4'-dibromobiphenyl-2,2'-diyl)dibenzosilinan-9-one with biphenyl-4,4'-ylenediboronic acid (Polymer 2)

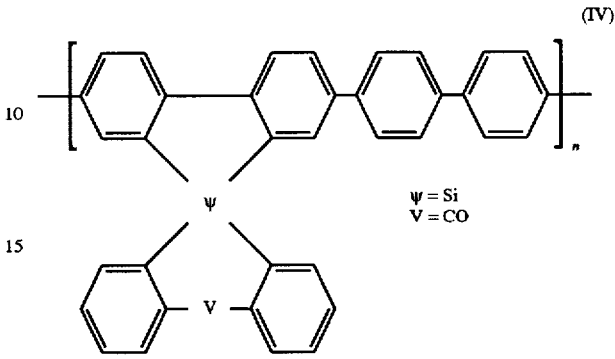

(IV)

1.04 g (2 mmol) of 10,10-(4,4'-dibromobiphenyl-2,2'-diyl)dibenzosilinan-9-one and 483 mg (2 mmol) of biphenyl-4,4'-ylenediboronic acid were added to a mixture of 25 ml of THF and 10 ml of ethanol. 20 ml of a 1 molar aqueous potassium carbonate solution were added thereto. The mixture was refluxed under nitrogen and 50 mg of tetrakis(triphenylphosphine)palladium dissolved in 5 ml of THF were added. After refluxing for 24 hours, the mixture was cooled to room temperature. The yellow polymer formed was filtered off with suction, boiled with dilute hydrochloric acid for 2 hours and after being again filtered off with suction was washed free of acid with water. Extraction with 100 ml of chloroform gave a first soluble polymer fraction (further soluble fractions were obtainable by extraction, for example with 1,2-dichloroethane and 1-chloronaphthalene).

Example 14

Starting from 2,2'-dichlorodiphenyl sulfide, biphenyl-2, 2'-diyldibenzo-9-thiasilinane was prepared using a method similar to Example 9, and after oxidation with 3-chloroperoxybenzoic acid this gave biphenyl-2,2'-diyldibenzo-9-thiasilinane 9,9-dioxide. The bromination thereof as described in Example 11 gave 10,10-(4,4'-dibromobiphenyl-2,2'-diyldibenzo-9-thiasilinane 9,9-dioxide) which was able to be reacted as described in Example 12 to give polymer 3 (formula III with V=—$SO_2$—) and as described in Example 13 to give polymer 4 (formula IV with V=—$SO_2$—).

Example 15

Photoluminescence measurement on polymer 1

A solution of the polymer 1 in chloroform (5 mg/ml) was applied by spin coating at 1000 rpm to a quartz support. On excitation with light having a wavelength<400 nm, the polymer film showed a homogeneous blue fluorescence. The fluorescence spectrum (Hitachi F4500 spectrofluorimeter, excitation at 360 nm) of the solid polymer film thus prepared compared with the fluorescence spectrum in dilute solution ($<10^{-4}$ mol/l in chloroform) gave a bathochromic shift of 10 nm for the film with maintenance of the spectral characteristics of the dilute solution.

Example 16

Photoluminescence measurement on polymer 2

A solution of the polymer 2 in chloroform (5 mg/ml) was applied by spin coating at 1000 rpm to a quartz support. On excitation with light having a wavelength<400 nm, the polymer film showed a homogenous blue fluorescence. The fluorescence spectrum (Hitachi F4500 spectrofluorimeter, excitation at 360 nm) of the solid polymer film thus prepared compared with the fluorescence spectrum in dilute solution ($<10^{-4}$ mol/l in chloroform) gives a bathochromic shift of 15 nm for the film with maintenance of the spectral characteristics of the dilute solution.

Example 17

Electroluminescence device

A solution of the polymer to be measured in chloroform (concentration: 15 mg/ml) was, under nitrogen, applied by spin coating at 1000 rpm to a glass support coated with ITO (indium-tin oxide) (structured, strips 2 mm wide). The glass support was transferred, with maintenance of the protective gas atmosphere, via a lock into a high vacuum vapor deposition unit. At $2 \times 10^{-5}$ mbar, Ca strips (2 mm wide, 230 nm thick) were vapor deposited using a mask on to the polymer layer at right angles to the ITO strips. The device thus obtained, ITO/polymer/Ca, was placed in a sample holder and the electrodes were connected to a power source via spring finger connectors, with an ITO strip being given positive polarity and a Ca strip being given negative polarity. On application of a potential of 20 V, a blue electroluminescence was observed at the corresponding matrix element.

What is claimed is:

1. A conjugated polymer comprising recurring units of the formula (I),

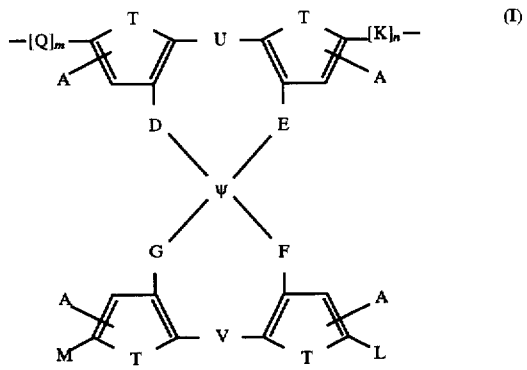

where the symbols and indices have the following meanings:
ψ is an element of the 4th main group of the Periodic Table with the exception of carbon;
D, E, F, G are identical or different and are each —CR$^1$R$^2$—, —O—, —S—, —NR$^3$— or a chemical bond; where R$^1$, R$^2$, R$^3$ are identical or different and are each a C$_1$–C$_{20}$-hydrocarbon radical or H or where R$^1$ and R$^2$ together can form an unsubstituted or substituted ring;
U is —CR$^4$=CR$^5$— or a chemical bond;
V is as defined for U or is —CR$^1$R$^2$—, —O—, —S—, —NR$^3$—, —SiR$^1$R$^2$—, —SO$_2$—, —SO—, —CO—, where R$^1$, R$^2$, R$^3$ are as defined above and R$^4$, R$^5$ are identical or different and can be as defined for R$^1$, R$^2$, R$^3$ or are fluorine or CF$_3$;
A are identical or different and are H, a C$_1$–C$_{20}$-hydrocarbon radical which can also contain heteroatoms;
T is —O—, —S—, —NR$^3$—, —CR$^1$R$^2$—, —CH=N—, —CA=CA—, —CH=CA—, —CH=CF— or —CF=CF—, where R$^1$, R$^2$, R$^3$ and A are as defined above;

K, L, M, Q are identical or different and are hydrocarbon radicals which can contain heteroatoms and have conjugated electron systems; where K, L, M, Q can also be joined to the groups A in the respective ortho positions to form a ring which is saturated, partially unsaturated or has maximum unsaturation;
m, n are identical or different and are 0, 1, 2, 3 or 4.

2. A polymer as claimed in claim 1, having from 2 to 1000 recurring units.

3. A polymer as claimed in claim 1 comprising recurring units of the formula (II),

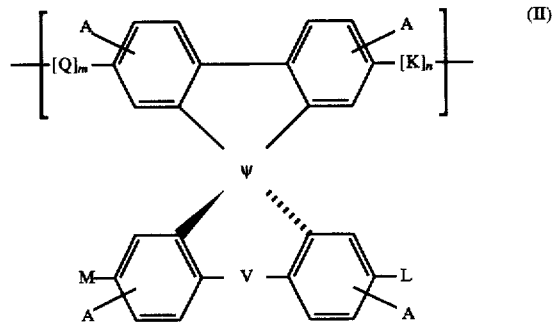

where the symbols and indices have the following meanings:
ψ is Sn, Ge or Si;
Q, K, L, M are identical or different and are each from one to fifteen identical or different arylene and/or heteroarylene and/or vinylene groups which may be unsubstituted or substituted;
A are identical or different substituents and can be as defined in the formula (I) in claim 1;
m, n are identical or different and are 0 or 1.

4. A polymer as claimed in claim 3, wherein the symbols and indices in the formula (II) have the following meanings:
A are identical or different and are R$^1$, R$^2$, R$^3$ and/or R$^4$;
Q, K are identical or different and are

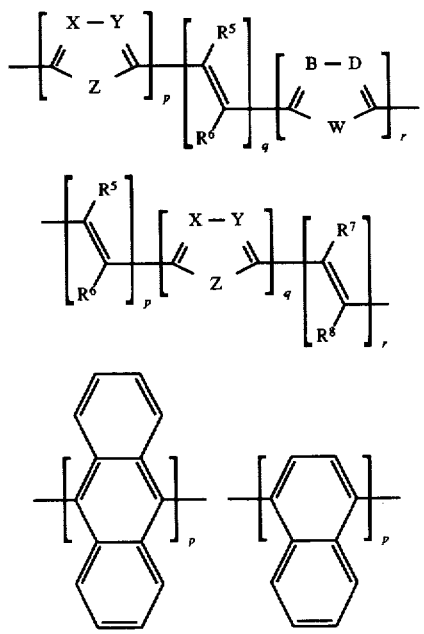

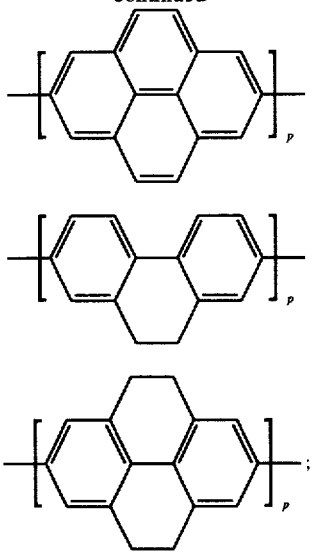

X, Y, B, D are identical or different and are CR⁵, N;

Z, W are identical or different and are O, S, NR⁵, CR⁵R⁶, —CR⁵=CR⁶—, —CR⁵=N—;

p, q, r independently of one another are identical or different and are 0, 1 to 5;

R¹, R², R³, R⁴, R⁵, R⁶, R⁷, R⁸ are identical or different and are each H, a straight-chain or branched alkyl, alkoxy or ester group having from 1 to 22 carbon atoms, aryl and/or aryloxy groups, where the aromatic may be substituted by C₁–C₂₂-alkyl, C₁–C₂₂-alkoxy, Br, Cl, F, CN and/or NO₂, or are Br, Cl, F, CN, NO₂ or CF₃;

L, M are identical or different and are

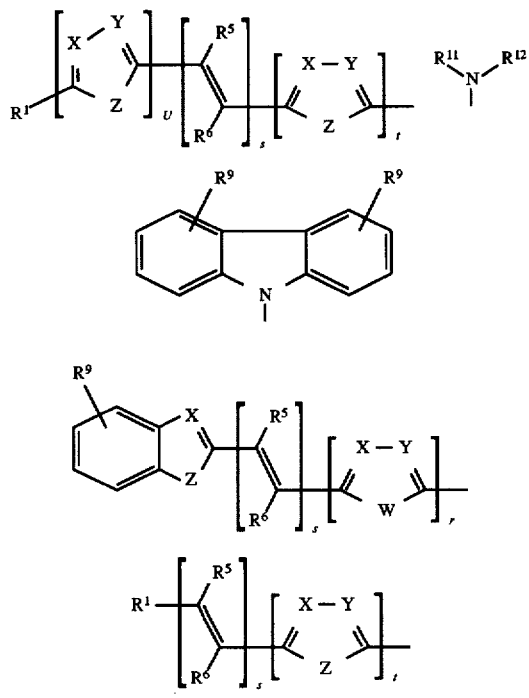

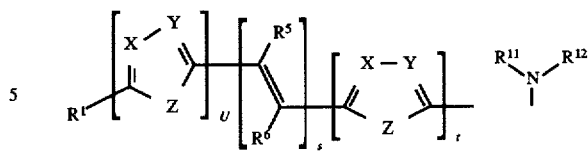

R⁹ are identical or different and are each H, an unbranched or branched alkyl or alkoxy group having from 1 to 22 carbon atoms, —CN, —NO₂, —NR¹¹R¹², phenyl, biphenyl, 1-naphthyl, 2-naphthyl, 2-thienyl, 2-furanyl, where aryls and heteroaryls can bear a further substituent R⁹;

X, Y are identical or different and are =CR⁵—, =N—;

Z are identical or different and are —O—, —S—, —NR¹¹—, CR⁵R⁶, —CR⁵=CR⁶—, —CR⁵=N—;

R¹¹, R¹² are identical or different and are each H, an unbranched or branched alkyl group having from 1 to 22 carbon atoms, phenyl, 3-methylphenyl, biphenyl, 1-naphthyl, 2-naphthyl.

5. A polymer as claimed in claim 3, wherein the symbols and indices in the formula (II) have the following meanings:

Q, K are identical or different and are

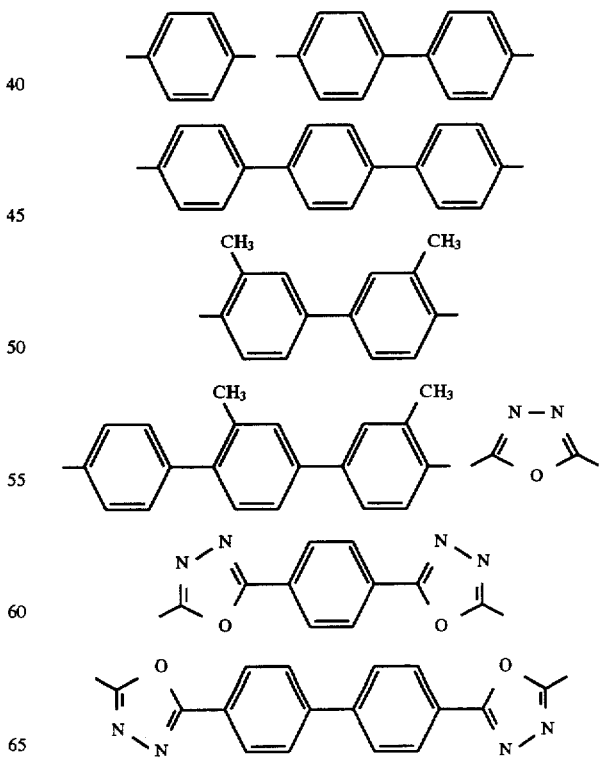

-continued
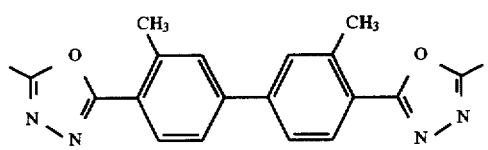
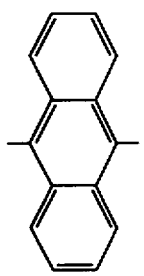
m, n are identical or different and are 0 or 1;
L, M are identical or different and are
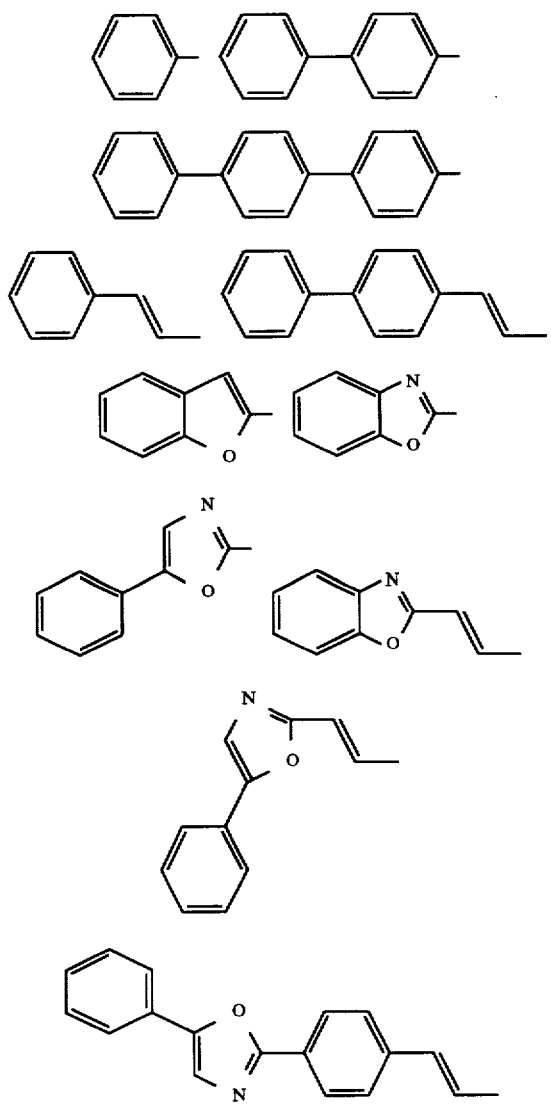
-continued
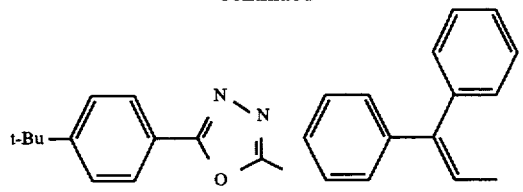
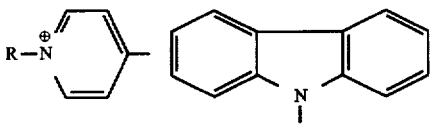
$R = C_1-C_{22}$-alkyl, $(CH_2)_x-SO_3^-$ where $x = 2, 3$ or $4$
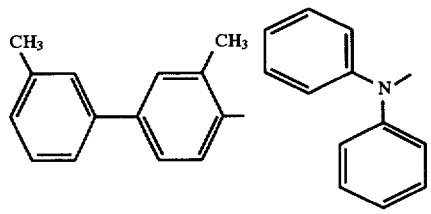
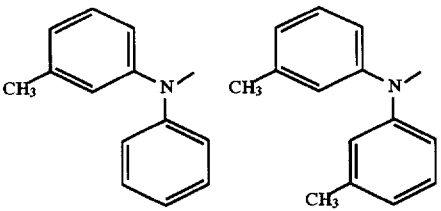
6. A polymer as claimed in one of claims 3 to 5, wherein the symbols and indices in the formula (II) have the following meanings:
Q, K are identical or different and are
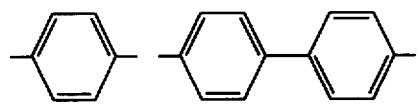
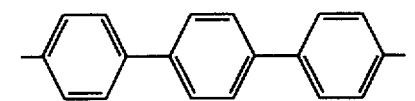
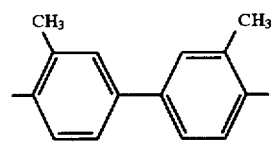
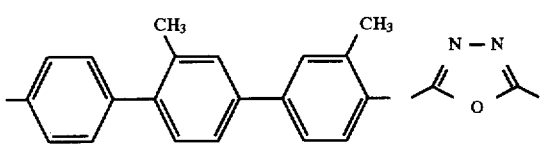
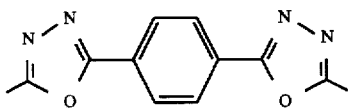

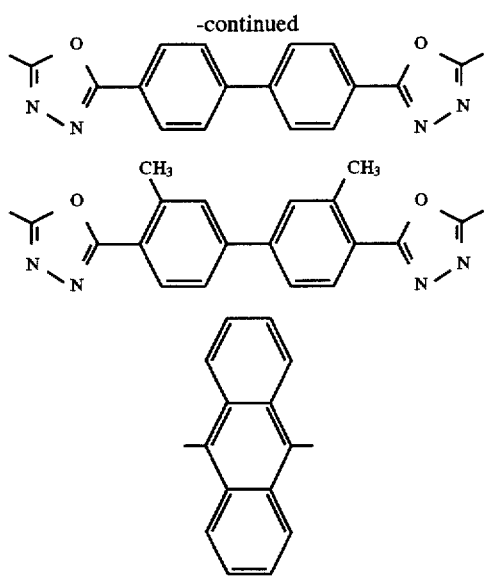

m+n is 0 or 1;

L, M are identical or different and are

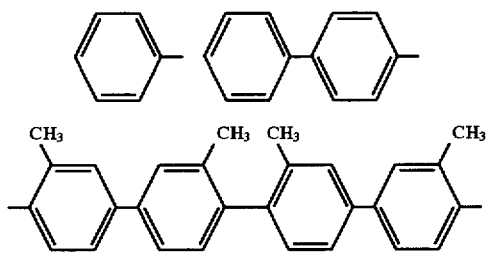

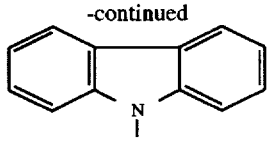

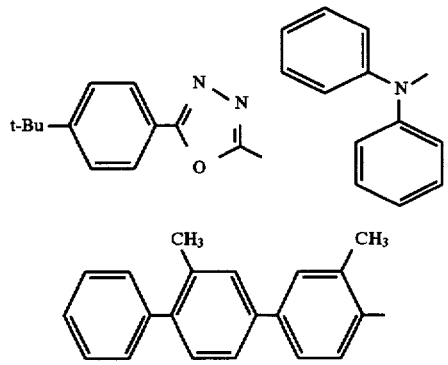

7. A polymer as claimed in claim 1 which is a copolymer.

8. A method of using the polymer as claimed in claim 1 as an electroluminescence material comprising the step of applying a potential to said polymer.

9. An electroluminescence material comprising a polymer as claimed in claim 1.

10. A process for producing an electroluminescence material, which comprises applying a polymer as claimed in claim 1 in the form of a film to a substrate.

11. An electroluminescence device comprising one or more active layers, wherein at least one of these active layers comprises a polymer as claimed in claim 1 as electroluminescence material.

* * * * *